Inventor
Herbert F. Storm
by Charles W. Helzer
His Attorney

March 29, 1966 H. F. STORM 3,243,602

SILICON CONTROLLED GATE TURN OFF SWITCH CIRCUIT
WITH LOAD CONNECTED TO INTERIOR JUNCTION

Filed Dec. 13, 1962 4 Sheets-Sheet 2

Inventor
Herbert F. Storm
by Charles W Helzer
His Attorney

Inventor
Herbert F. Storm
by Charles W. Helzer
His Attorney

March 29, 1966 H. F. STORM 3,243,602

SILICON CONTROLLED GATE TURN OFF SWITCH CIRCUIT WITH LOAD CONNECTED TO INTERIOR JUNCTION

Filed Dec. 13, 1962 4 Sheets-Sheet 4

Inventor
Herbert F. Storm
by Charles W. Helzer
His Attorney 3,243,602

SILICON CONTROLLED GATE TURN OFF SWITCH CIRCUIT WITH LOAD CONNECTED TO INTERIOR JUNCTION

Herbert F. Storm, Delmar, N.Y., assignor to General Electric Company, a corporation of New York Filed Dec. 13, 1962, Ser. No. 244,412
6 Claims. (Cl. 307—88.5)

The present invention relates to a new and improved semi-conductor amplifier circuit.

More specifically, the invention relates to a new and improved amplifier circuit employing a turn-off silicon controlled rectifier sometimes referred to as a silicon controlled switch.

A turn-off silicon controlled rectifier (hereafter referred to as a turn-off SCR) comprises a four-layer p-n-p-n semi-conductor device having two emitting layers and two gating layers, and fabricated in such a manner as to provide access to all four layers. Fabrication of the SCR in this manner allows the mode of operation of the device to be controlled by external circuitry connected to the two gating layers hereinafter called gates. A conventional SCR having only one accessible gate operates in much the same manner as a grid controlled gas discharge tube in that once the control grid initiates conduction through the SCR, it thereafter loses control over conduction through the device. In contrast to the conventional SCR, the turn-off SCR has two accessible gates to which control circuitry is connected to turn the device off, as well as on. It should also be noted, that the turn-off SCR may differ from a conventional transistor in that it is an off-on device merely requiring pulses of control current for turn-on and turn-off; while a conventional transistor requires that a gate (base) current be applied to the gate to maintain conduction through the device, and turn-off is achieved by reducing this gate current to zero. The turn-off SCR constitutes an important new tool for use by electronic and control engineers in the fabrication of electronic and control circuits. The present invention comprises a new and improved family of amplifier circuits employing turn-off SCR's, which possess many unusual and desirable characteristics.

It is therefore, an object to the present invention to provide a new and improved turn-off SCR circuit having a variable alternating current gain.

Another object of the invention is to provide a turn-off SCR amplifier circuit capable of dual threshold (or tristable) operation.

Still another object of the invention is the provision of a turn-off SCR amplifier circuit which is capable of turn-on, turn-off bistable operation through the means of a gate signal alone, and which when once turned on, stays on and requires no gate current, and to be turned off requires only a negative gate signal pulse applied to the gate circuit;

A further object of the invention is the provision of a turn-off SCR amplifier circuit which when operated in a bistable mode is capable of attaining an effective gain which is increased by a factor twenty times the original gain of the device when connected in a normal SCR manner;

Still a further object of the invention is the provision of a turn-off SCR amplifier circuit which possesses an inherent overcurrent cutoff characteristic; and A still further object of the invention is the provision of a turn-off SCR amplifier circuit which requires no holding current.

In practicing the invention a new and improved turn-off SCR amplifier circuit is provided which includes a turn-off SCR comprised by a four layer p-n-p-n semiconductor device. The semiconductor device is designed to have one high efficiency emitting junction, which in combination with its adjacent high gain gate layer produces high current amplification (usually denoted by the symbal $\alpha$), and another low efficiency junction (on the other side of the center junction) which, in combination with its adjacent low gain gate layer produces low current amplification. Means are provided for connecting a source of electric potential across the device together with biasing means which are adapted to be connected in circuit relationship with both emitting junctions of the device through the source of electric potential. A load is operatively connected to the low-gain gate of the device, and a gate signal source is operatively connected to the high-gain gate of the device.

Other objects, features and many of the attendant advantages of this invention will be appreciated more readily as the same becomes better understood by reference to the following detailed description, when considered in connection with the accompanying drawings, wherein like parts in each of the several figures are identified by the same reference character, and wherein.

Figure 1:
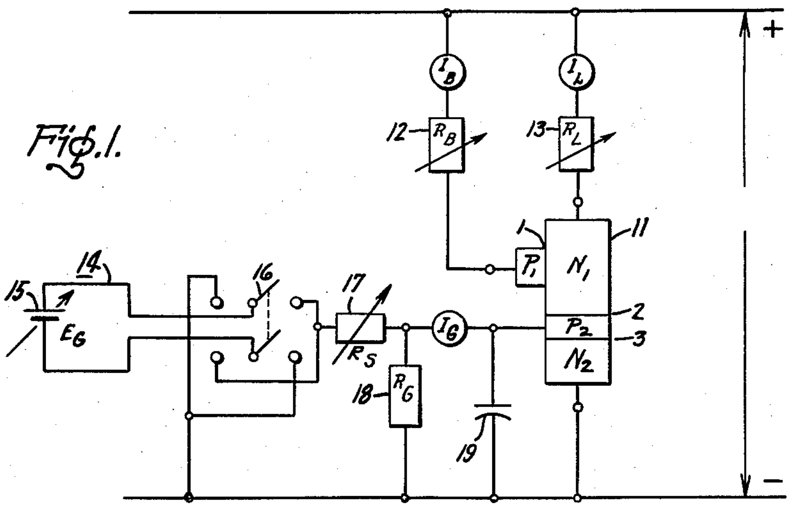
FIGURE 1 is a schematic circuit diagram of a new and improved turn-off SCR amplifier circuit constructed in accordance with the present invention.
Figure 2:
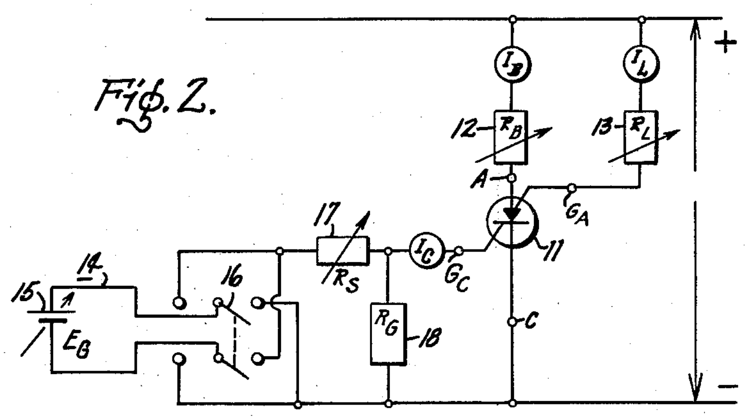
FIGURE 2 is a schematic circuit diagram of the same circuit shown in FIGURE 1, but is an illustration of the circuit utilizing a different symbol for the turn-off SCR device.
Figure 2A:
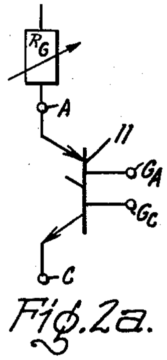
Figure 3:
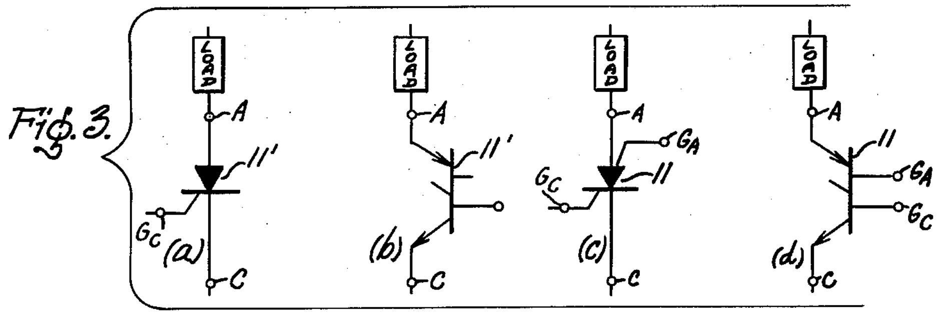
Figure 4:
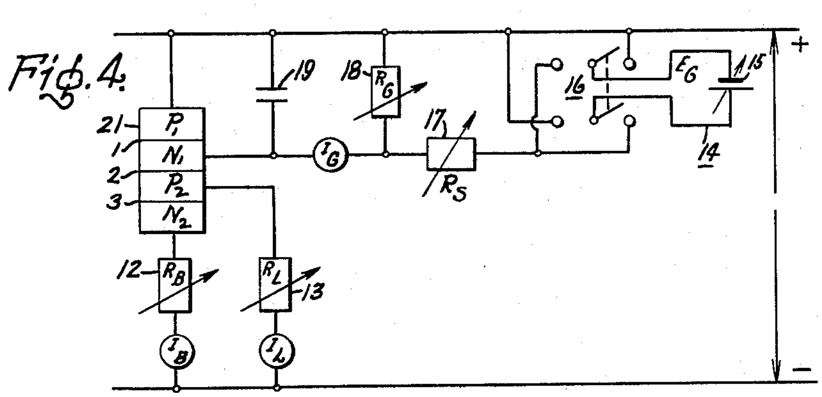
Figure 5:
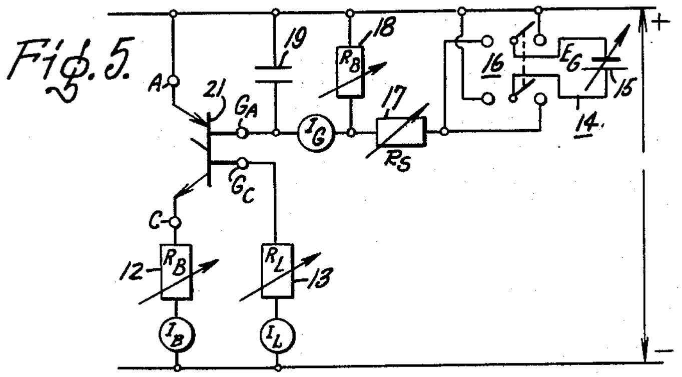
Figure 5A:
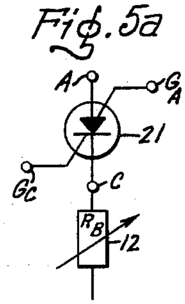
Figure 6:
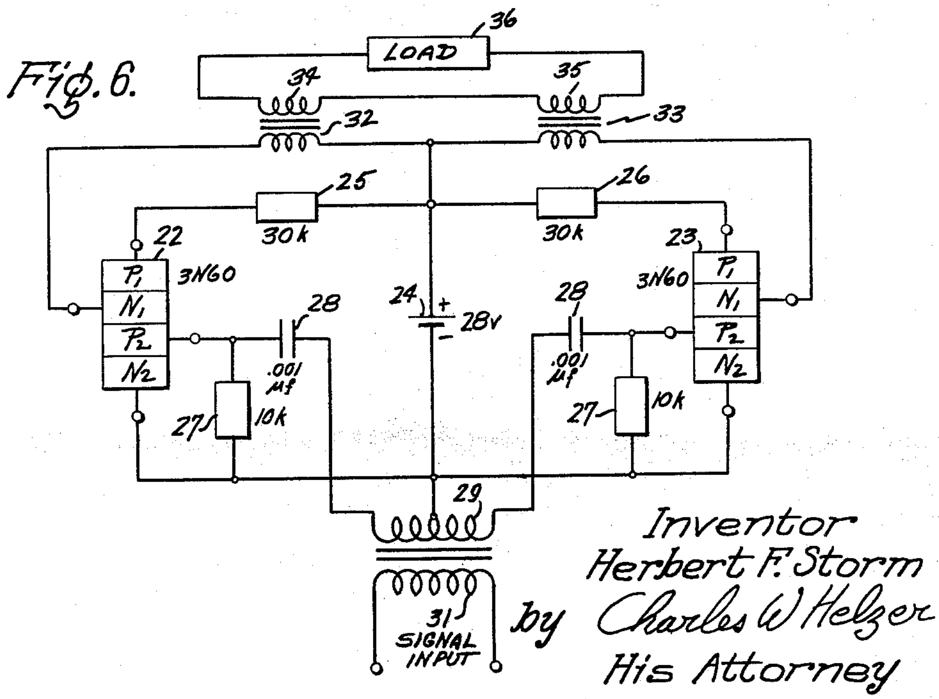
Figure 7:
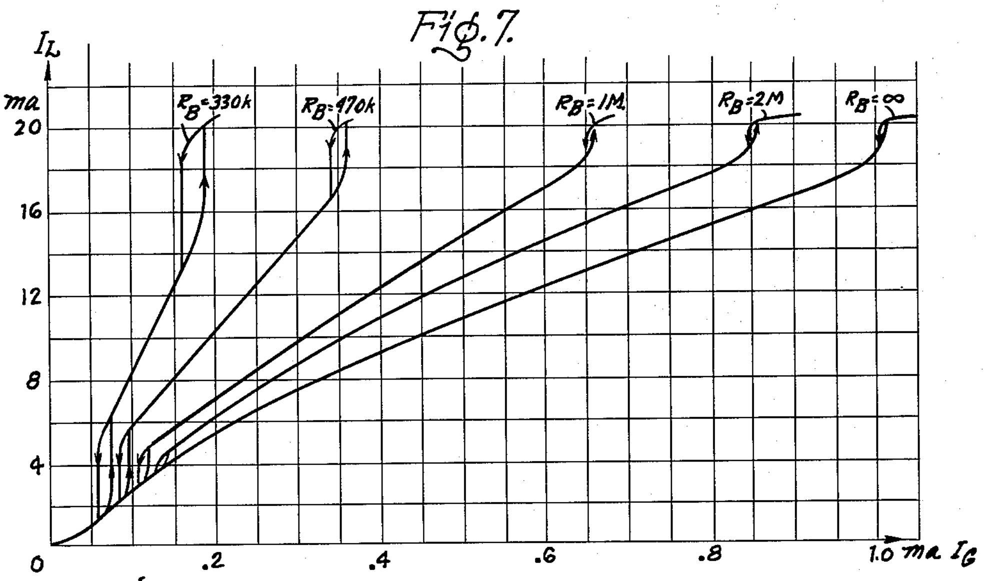

FIGURE 2*a* is an alternative symbol in identifying the turn-off SCR device which could be employed in place of the symbol used in the circuit arrangement of FIGURE 2;

FIGURE 3 shows a series of different circuit branches employing turn-off SCR's connected in a conventional manner, and as taught by the present invention, and illustrates the difference;

FIGURE 4 is a detailed circuit diagram of still a second version of a new and improved amplifier circuit constructed in accordance with the invention, and employed in p-n-p-n semiconductor device which has been fabricated in a different manner from the p-n-p-n semiconductor device employed in the circuit of FIGURE 1;

FIGURE 5 is a circuit diagram of an equivalent circuit to that shown in FIGURE 4 but employs a different symbol for the turn-off SCR device;

FIGURE 5*a* is an alternative symbol employed by many electrical engineers in identifying a turn-off SCR which could be used in place of the symbol employed in FIGURE 5 of the drawings;

FIGURE 6 is a schematic circuit diagram of a new and improved inverter circuit employing the basic amplifier circuit configuration of the present invention;

FIGURE 7 is a characteristic curve of the amplifier circuit shown in FIGURE 1 and illustrates the load current versus gate current characteristic of the circuit for varying values of bias resistance $R_B$.

Figure 8:
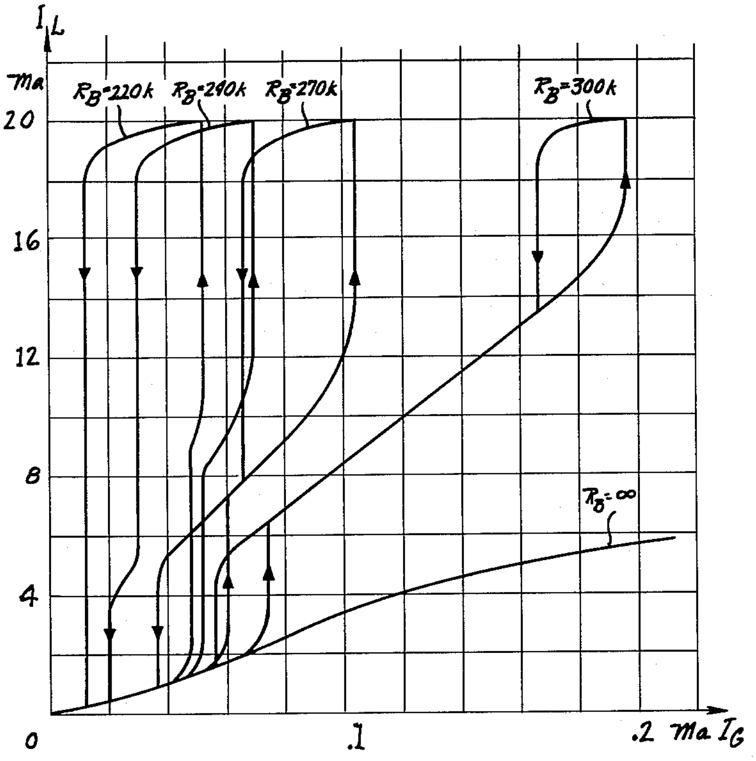

FIGURE 8 is a second control characteristic curve for the circuit of FIGURE 1 and illustrates the variation of the load current versus gate current characteristic of the circuit, while the value of the bias resistance $R_B$ is varied between the ranges of 330 to 220 kilo-ohms (k.).

Figure 9:
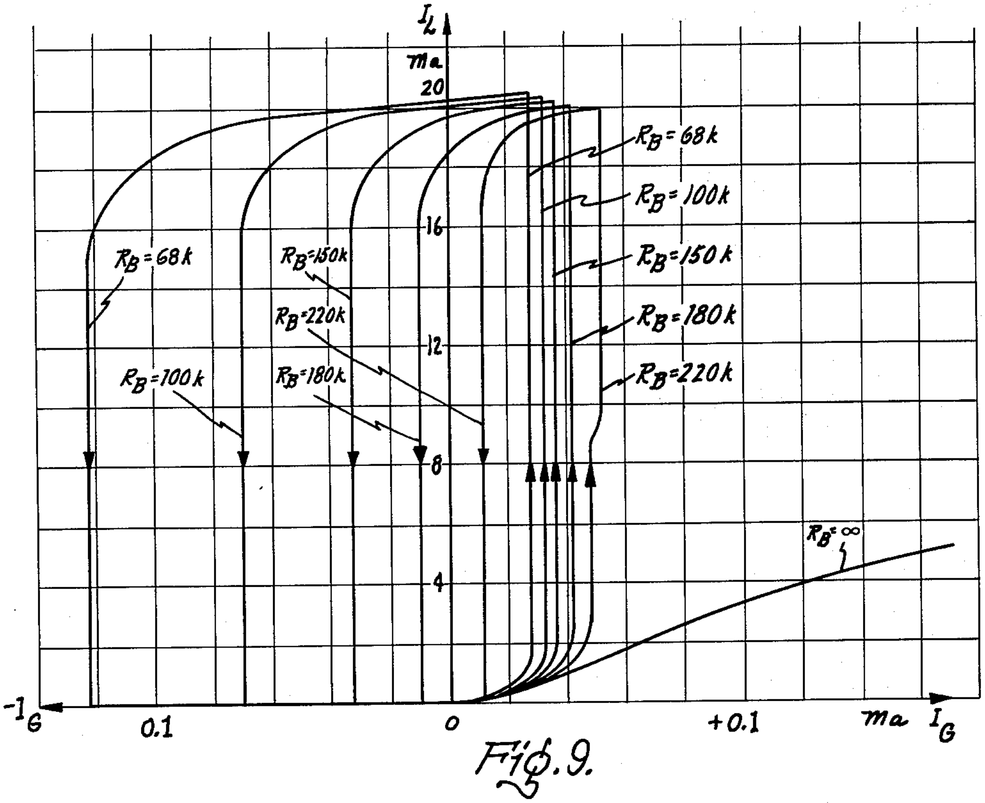
Figures 10, 11:
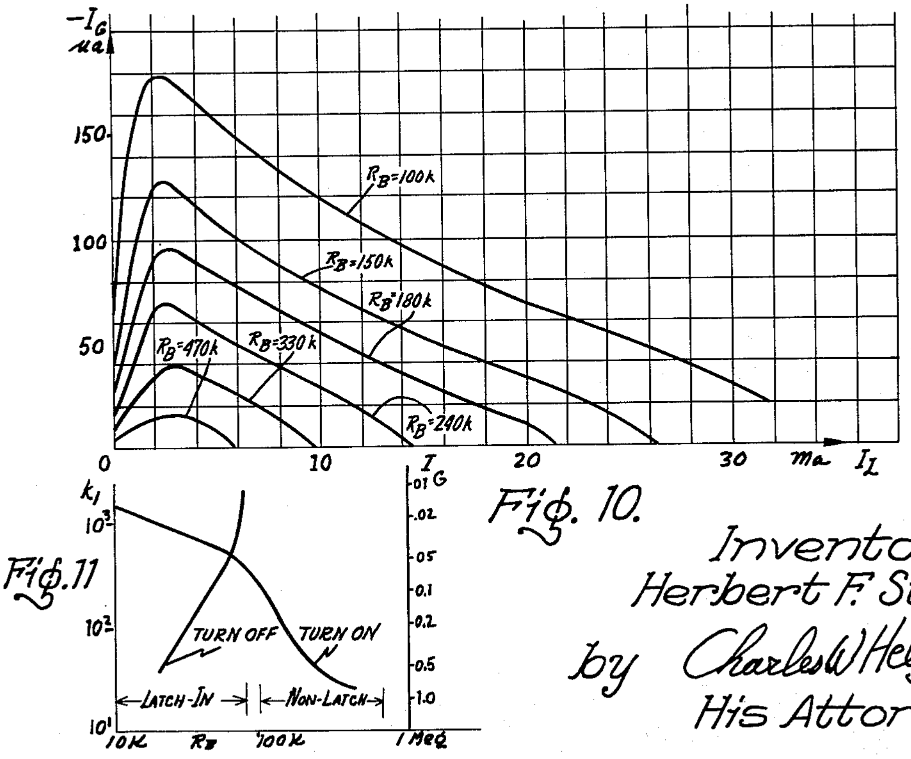

FIGURE 9 is a third control characteristic curve for the circuit in FIGURE 1 and illustrates the variation of load current versus gate current of the circuit with variations of the value of the bias resistance $R_B$ between the value of 220 kilo-ohms to 68 kilo-ohms;

FIGURE 10 is still a fourth characteristic curve of the amplifier circuit shown in FIGURE 1, and shows a plot of the turn off gate current ($I_G$) as a function of the load current $I_L$ for various values of the bias resistance $R_B$ between the ranges of 470 kilo-ohms to 100 kilo-ohms while the load resistance $I_L$ is varied; and FIGURE 11 is a plot of the gating current $I_G$ versus the gain $$\left(K_I=\frac{I_L}{I_G}\right)$$

for the circuit of FIGURE 1 while operating in the bistable, turn-on, turn-off region of its characteristic curve.

The turn-off SCR is a four-layer, three-junction p-n-p-n semiconductor device having all four layers accessible, and can be turned-on and turned-off by current pulses of opposite polarity applied to the gating layers. The turn-off SCR can be viewed as a transistor with an extra junction and lead, or it may be considered as a SCR with two control gates. The turn-off SCR merges the control properties of the transistor with a SCR device, and hence can be turned off without commutating components. This allows circuits employing such devices to be greatly simplified as well as reduced in size and cost, and makes possible improvements in the efficiency of such circuits. Additionally, it makes possible the use of the device in new circuit functions. Turn-off SCR's are already commercially available under a variety of names. For example, the Semiconductor Products Department of the General Electric Company manufactures for sale a line of such devices identified as Silicon Controlled Switches—General Electric Types 3N58, 3N59 and 3N60, the characteristics of which are described in a Specification Sheet 65.10 entitled, "Silicon Controlled Switches," published March 1962, and in an application note entitled, "Silicon Controlled Switch," Publication No. 90.4, published April 1962. For a more detailed description of the characteristics of the turn-off SCR itself, reference is made to the above identified publications of the General Electric Company, copies of which may be obtained from the Semiconductor Products Department of the General Electric Company, Electronics Park, Syracuse, New York.

A p-n-p-n semiconductor device having four accessible layers and three junctions is illustrated at 11 in FIGURE 1. This particular p-n-p-n device (referred to above as a turn-off SCR, and as a silicon controlled switch) was fabricated by attaching a p-layer to a n-p-n junction transistor. It is of course possible to fabricate such a device by attaching an n-layer to a p-n-p transistor in which event, the physical appearance of the transistor would be represented differently from that shown at 11 in FIGURE 1; however, no matter how fabricated, the result is four-layer p-n-p-n semiconductor device having four accessible layers and three junctions.

If a current $I_L$ is caused to flow through the device 11, an accumulation or depletion of majority carriers occurs in the gating layers n-1 and p-2 at a rate r, where:

$$r=[\alpha_{1,2}-(1-\alpha_{3,2})]I_L \quad (1)$$

and wherein the value $r$ is the rate of carrier accumulation or depletion, $\alpha_{1,2}$ is the current gain from the junction 1 to 2, $\alpha_{3,2}$ is the current gain from junction 3 to 2, and $I_L$ is the load current flowing through the device. If the expression $\alpha_{1,2}-(1-\alpha_{3,2})$ is greater than 1, then the rate $r$ will be positive, and the SCR 11 will be in its low impedance or conducting mode wherein the total voltage drop over all three junctions is in the vicinity of 1 volt. If the expression $\alpha_{1,2}-(1-\alpha_{3,2})$ is less than 1, the rate $r$ will be negative, and the turn-off SCR will be in its high impedance or blocking mode wherein the device passes only a very small current called a "forward leakage current." The term "gate turn-off" means the change from the low impedance or conducting mode to the high impedance or blocking mode of operation by means of a gate current supplied to the $P_2$ layer of the device 11 shown in FIGURE 1 of the drawings.

If it is assumed that the semiconductor device 11 is operating in its low impedance mode, and a gate current $I_G$ is then withdrawn from the $P_2$ layer resulting in a carrier depletion at a rate $r_d=\alpha_{3,2}I_G$. Assuming $r_d=r$, then the generation of the forward E.M.F. at the center junction 2 in the direction of the applied voltage across the device will be wiped out, and the stage is set for the development of a counter E.M.F. developed across the center junction 2 which typifies the high impedance mode of operation of the semiconductor device. By substituting the expression $r_d=\alpha_{3,2}I_G$ into Expression 1 the expression for the turn-off gate current $I_G$ can be obtained $$I_G=\frac{\alpha_{1,2}-(1-\alpha_{3,2})}{\alpha_{3,2}}\cdot I_L \quad (2)$$

It is to be noted that for ordinary SCR's employing only a single gate, Equation 2 indicates a turn-off gate current $I_G$ of about half of the rated load current would be required, and this would be too large a gate current for practical purposes.

One of the key factors in the design of a successful turn-off SCR is the reduction of the turn-off gate current $I_G$. In order to appreciate the significance of this statement, it is necessary to see the magnitude of the turn-off gate current $I_G$ in its proper perspective by relating it to the load current $I_L$ to be turned off. This relation is expressed by the turn-off current gain $K_I$ where:

$$K_I=\frac{I_L}{I_G} \quad (3)$$

Substituting Equation 3 in Equation 2 it can be appreciated that:

$$K_I=\frac{\alpha_{3,2}}{\alpha_{1,2}-(1-\alpha_{3,2})} \quad (4)$$

From a consideration of Expression 4, it can be appreciated that large turn-off current gains $K_I$ can be expected by reducing the difference in the denominator in Equation 4 to a very small quantity through increasing the subtrahend or decreasing the minuend. This can be accomplished by either external circuitry or internal junction design, or a combination of both. It has been determined that the best approach to the problem is by the combination of the proper fabrication of the p-n-p-n semiconductor device, together with the connection of the external circuitry so that a bias current $I_B$ is fed into the $p_1$ layer, and load current $I_L$ supplied to the $n_1$ layer, in which event the load current $I_L$ will deplete the inner bases at a rate $r$ as set forth in Expression 1.

$$r=\left[\alpha_{1,2}-(1-\alpha_{3,2})\left(1+\frac{I_B}{I_L}\right)\right]\left(\frac{I_B}{I_L}\right)\cdot I_L$$
$$=\left[\frac{\alpha_{1,2}}{1+\frac{I_L}{I_B}}-(1-\alpha_{3,2})\right]\left(\frac{I_B}{I_L}+1\right)\cdot I_E \quad (5)$$

The turn-off current gain $K_I$ may then be obtained by substituting Equation 5 in Equation 3, and it appears that:

$$K_I=\frac{\alpha_{3,2}}{\alpha_{1,2}-(1-\alpha_{3,2})\left(1+\frac{I_L}{I_B}\right)}\cdot\frac{I_L}{I_B}$$
$$=\frac{\alpha_{3,2}}{\frac{\alpha_{1,2}}{1+\frac{I_L}{I_B}}-(1-\alpha_{3,2})}\cdot\frac{1}{\frac{I_B}{I_L}+1} \quad (6)$$

From an examination of Expression 6 it can be appreciated that the turn-off current gain $K_I$ is larger than the turn-off gain set forth in Expression 4 because of the reduction of the minuend by the factor $$\left(1+\frac{I_L}{I_B}\right)$$

It is understood of course that the bias current $I_B$ is small with respect to load current $I_L$. Therefor Equation 6 can be approximated by the following expression:

$$K_I = \frac{\alpha_{3,2}}{\alpha_{1,2} \cdot \frac{I_B}{I_L} - (1 - \alpha_{3,2})} \qquad (7)$$

From a consideration in Expression 7, it can be appreciated that the four layer p-n-p-n semiconductor device 11 should be fabricated in such a manner that it possesses a high current gain $\alpha_{3,2}$, and a low current gain $\alpha_{1,2}$. The semiconductor device 11 employed in the circuit of FIGURE 1 was fabricated in this manner. Since the techniques of manufacture of p-n-p-n semiconductor devices for providing the above described characteristics are well known, it is believed unnecessary to detail the method by which these characteristics are obtained in the p-n-p-n semiconductor device. All that would be required is to merely specifiy these requirements in ordering the device from any of the known manufacturers of p-n-p-n semiconductor devices.

From the foregoing description, it can be appreciated that the four layer p-n-p-n semiconductor device 11 shown in FIGURE 1 of the drawing is fabricated in a manner such that it has an outer n-layer marked $n_2$ contiguous to a high gain gating p-layer marked $p_2$, with the two layers being separated by an emitting junction 3. The p-n-p-n semiconductor device further includes an outer p-layer marked $p_1$ contiguous to a low gain gating n-layer marked $n_1$ (hereinafter called the low gain gate with the two layers being separated by an emitting junction 1. The low gain gate $n_1$ and a high gain gating layer $p_2$ (hereinafter called the high gain gate) are separated by a collecting junction marked 2.

The circuit of FIGURE 1 is completed by a means which can be said to comprise the output terminals connected to the outer $p_1$ and $n_2$ layers for connecting the p-n-p-n semiconductor device across a source of electric potential (not shown) but whose terminals are indicated by plus-minus (+, —) signs. A biasing means indicated as a variable resistor 12 is connected in circuit relationship with both outer layers $p_1$ and $n_2$ through the source of electric potential since the variable biasing resistor 12 is connected between the outer $p_1$ layer and the positive terminal of the source of electric potential, and the output terminal from the outer $n_2$ layer is connected directly to the negative terminal of the source of electric potential. A load comprised by a variable resistor 13 is connected between the low gain gate $n_1$ and the positive terminal of the source of electric potential. To complete the circuit, a gate signal source shown generally at 14 is operatively connected to the high gain gate $p_2$ of the p-n-p-n semiconductor device 11. The gate signal source is comprised by a source of electric gate potential 15 which is connected to the fixed contacts of a double-pole, double-throw reversing switch 16. The reversing switch 16 is used to reverse the polarity of the gate potential supplied from the voltage source 15 to the high gain gate $p_2$, and for this purpose has two of its fixed contacts connected directly to the negative terminal of the main source of electric potential, and the remaining two terminals connected through a variable resistor 17 to the high gain gate $p_2$ layer of the p-n-p-n semiconductor device 11. If desired, a gate resistor 18 and a smoothing capacitor 19 may be connected between the high gain gate $p_2$, and the negative terminal of the source of electric potential. The small circles marked ($I_L$), ($I_B$) and ($I_G$)

inserted in the leads of the load circuit, the biasing circuit, and the gating circuit are merely placed there to indicate the points where the various currents indicated are measured.

For the purpose of the following discussion the gate current $I_G$ shall be defined as that current flowing into or out of the high gain gate $p_2$ of the semiconductor device 11, the bias current $I_B$ shall be defined as that bias current supplied to the outer $p_1$ layer of the semiconductor device shown in FIGURE 11, and the load current is that current $I_L$ flowing into the low gain gate $n_1$ of the semiconductor device 11. FIGURES 7, 8 and 9 of the drawings are plots of the load current versus gate current characteristics of the circuit shown in FIGURE 1 of the drawing wherein the gate current $I_G$ is plotted as the abscissa measured in milliamperes, and the load current $I_L$ is plotted as the ordinate, measured in milliamperes. The characteristic curves illustrated in FIGURES 7, 8 and 9 were obtained with a fixed power supply of 28 volts direct current, a load resistance $R_L$ having a value of one kilo-ohm, and while operating the circuit in an ambient temperature of 25° C. Assuming first an operating condition where the value of the bias resistor $R_B=\infty$ (which is equivalent to the circuit branch including $R_B$ being open circuited) then semiconductor device 11 will operate as a standard transistor, and will exhibit a load current versus gating current characteristic shown in FIGURE 7 of the drawings for a value of $R_B$ equal to infinity ($R_B=\infty$). While operating in this mode, the circuit exhibits a normal, more or less linear output over most of the range of values of the gate current $I_G$ except near saturation level where the load current exhibits an instability in the form of a double value hysteresis effect. Assume now that the value of bias resistance $R_B$ is adjusted to be less than infinity so that a bias current $I_B$ is admitted to the outer $p_1$ layer, then a portion of this bias current will reach the high gain gate $p_2$ where it aids the gate current $I_G$, and hence causes an increase in the load current $I_L$ in the manner exhibited in FIGURES 7, 8 and 9 of the drawings. In order to clearly illustrate the operating characteristics obtained by varying the value of the bias resistor $R_B$, and hence varying the bias current $I_B$, the operating characteristics of the circuit have been illustrated in three separate FIGURES 7, 8 and 9, since quite pronounced different effects are obtained from the circuit over the different ranges of values of bias resistance $R_B$ plotted in each of the figures illustrated. Referring again to FIGURE 7 of the drawings, for a value of bias resistance $R_B=2$ megohms, it can be appreciated that a new zone of instability develops in the vicinity of load current $I_L=4$ milliamps along with the previous zone of instability near load current $I_L=19$ milliamps which becomes enlarged. As the value of the bias resistance $R_B$ is further reduced it can be appreciated that the quasi-linear portion of the control characteristic becomes steeper, and relatively shorter as will be apparent from an examination of FIGURES 7 and 8 of the drawings. Additionally, for decreasing values of bias resistance $R_B$, the two zones of instability grow in both width and height as illustrated most clearly in FIGURE 8 of the drawings, until the two zones of instability are merged partially at a value of bias resistance $R_B$ somewhere between 200 kilo-ohms and 270 kilo-ohms. Further deduction of the value of the bias resistance $R_B$ causes the two zones of instability to merge completely, and thus produce plain on-off switching action at values of $R_B$ less than 200 kilo-ohms as illustrated in FIGURE 9 of the drawings.

If it is desired to use the circuit of FIGURE 1 as an alternating current amplifier, it is well established that the alternating current gain of a semiconductor device such as 11 is proportional to the slope of its input or gating current $I_G$ versus output load current $I_L$ characteristics. If it is assumed that a quiescent gate current of a median value approximately $I_G=.2$ milliampere is established in the circuit of FIGURE 1, and an alternating current signal to be amplified is superimposed thereon, then the alternating current gain of the amplifier will be proportional to the slope of the characteristic curve in the vicinity of the gating current $I_G=.2$ of a milliampere. It can be appreciated therefore that by merely changing the value of the bias resistance $R_B$ from a value between $R_B=\infty$ to $R_B$=470 kilo-ohms, the alternating current gain of the circuit can be increased by a factor of about 2. Hence, it can be appreciated that the circuit makes available an alternating current amplifier having a variable alternating current gain.

From a further consideration of FIGURES 7 and 8 of the drawings, it can be appreciated that the circuit in FIGURE 1 constitutes a dual or double threshold device. That is to say, as the gate current $I_G$ increases it will reach a first threshold value where a sudden increase in load current $I_L$ will be exhibited, and then if $I_G$ continues to increase, a second threshold value will be reached where again a second sudden increase in load current will occur. Such a characteristic suggests that the circuit can be used as a tri-stable element, or it may be used in applications where it is desired to actuate a relay or indicating light upon the gate current $I_G$ reaching the first threshold value, and then if the gate current $I_G$ still continues to climb and reaches the second threshold value, a second control function such as the actuation of a circuit interrupter, can be obtained. In such applications, the value of the bias current $I_B$ can be varied to thereby control either the magnitude of the lower threshold value, the ratio of the two threshold values, and/or the magnitude of the load current increases upon reaching a threshold value. It has also been determined that the insertion of a resistor between the negative terminal of the direct current power supply and the outer $n_2$ layer can be used to control the width of the zone of instability.

In addition to the above suggested uses, semiconductor devices are often used in circuits for information and control purposes where turn-on and stay-on are required for as long as a control signal is present, and turn-off is to occur when the control signal is discontinued. Operation of a semiconductor device in this manner is often referred to as non latch-in relay operation.

From a further consideration of FIGURE 7 of the drawings it can be seen that for a value of bias resistance where $R_B=\infty$, a gate current $I_G$ of approximately one milliamp is needed to turn-on the semiconductor device to provide a load current $I_L$ of 20 milliamps. The current gain denoted $K_I$ of a semiconductor device is given by Expression 3, so that in the above cited example, it can be appreciated that a turn-on current gain $K_I$ of 20 is obtained for the condition cited. However, if the value of the bias resistance $R_B$ is reduced to a value in a neighborhood of about 220 kilo-ohms, then a gating current $I_G$ of about .05 milliamp will turn on a load current of 20 milliamps thereby producing a current gain $K_I$=400. Accordingly, it can be appreciated that when the semiconductor device is operated in this mode, a control sensitivity can be obtained by proper variation of the value of the bias resistance $R_B$ to effect a transistor switch whose sensitivity is increased by a factor of 20 or more. Such a substantial increase in sensitivity is of considerable importance in the above cited information and control applications area where it is often necessary to work with control and information sensing signals having minimum values.

From a consideration of FIGURE 9 of the drawings, it can be appreciated that for values of the bias resistance $R_B$ between the range of approximately 180 kilo-ohms to 68 kilo-ohms the circuit of FIGURE 1 will operate as a bistable element in that once it has been turned on by a positive polarity gating signal pulse $+I_G$ having a value in the order of .04 milliamp applied to the gating $p_2$ layer, the circuit will remain on thereafter until turned off by a negative polarity gating signal pulse $-I_G$ applied to the high-gain gate $p_2$ layer. Accordingly, it can be appreciated that the circuit of FIGURE 1 can be operated in a mode which is termed latch-in relay operation wherein depending upon the polarity of the gating signal pulse, either turn-on or turn-off is achieved. The greatest advantage of operation of circuit in this mode is that it eliminates the need for a continuously applied gate signal with its attendant power requirements and losses during the turn-on periods. From a consideration of FIGURES 10 and 11 of the drawings, it can be appreciated that very high turn-on and turn-off gains can be obtained with the circuit of FIGURE 1 when operated in the latch-in relay switching mode. FIGURE 11 of the drawings is a plot of the turn-on, turn-off switching characteristics of the circuit of FIGURE 1 when operated in the latch-in relay switching mode. The switching characteristics shown in FIGURE 11 were obtained with the bias resistance $R_B$ being varied between a value of about two megohms to 10 kilo-ohms, a direct current supply voltage of 28 volts, a load resistor $R_L$ of one kilo-ohm, and a load current $I_L$ of 20 milliamps, the circuit being operated in ambient temperature of 25° C. FIGURE 11 of the drawings is actually a plot of two curves, one of the curves being for turn-on, and the other of the curves being for turn-off. Only one scale is used to show the value of the gate current $I_G$, with $I_G$ being reckoned as positive when applied to the turn-on characteristic curve, and being considered negative when applied to the turn-off characteristic curve. These two characteristic curves should also be considered as boundaries of, and functions for, the value of the bias resistance $R_B$ and the gate current $I_G$ required to produce switching action. All values below and to the left of the turn-on characteristic curve therefore will produce turn-on, and all values below and to the right of the turn-off characteristic curve will produce turn-off. If it is assumed that the load current $I_L$ is fairly constant, that is, it is not changing by more than plus or minus 2.5%, then from a consideration of FIGURE 11 it can be appreciated that turn-off gains of the value of 2000 are available. Should the load current $I_L$ vary over a wider range than this, then the turn-off gains obtained will decline in value as can be appreciated from FIGURE 10 of the drawings.

With the circuit in FIGURE 1 designed in a manner to provide turn-off gain of 2000, a turn-off gate current of only .01 milliampere would be effective to turn off a load current flowing through the semiconductor device of 20 milliamperes. Such turn-off capabilities therefore suggest that the device may be readily incorporated in an inverter circuit, for example, thereby making it possible to eliminate commutating components since they would no longer be needed to turn-off the current flowing in the semiconductor device after initiation of current flow therethrough. Elimination of such commutating components would therefore reduce the cost, size and complexity as well as losses of the inverter greatly, and one such inverter circuit is illustrated in FIGURE 6. A more detailed description of the construction of the operation of the inverter circuit shown in FIGURE 6, will be provided hereinafter. Additional uses for the circuit of FIGURE 1, when designed to operate in its latch-in relay switching modes would be for use as a memory cell with nondestructive readout using two control gates, or as a frequency dividing circuit. Additionally, by using more sophisticated means for controlling the value of the bias current $I_B$, additional switching functions are made possible. From a consideration of the preceding discussion therefor, it can be appreciated that the new and improved amplifier circuit of FIGURE 1 can be switched by the joint action of two control signal inputs as contrasted to a conventional transistor or SCR, which have only a single control signal input, and hence the circuit of FIGURE 1 can be used to perform a much wider variety of control and information handling functions.

FIGURE 10 of the drawing is a plot of the load current $I_L$ versus the gate current $I_G$ of the circuit of FIGURE 1 when operating in the latch-in relay switching mode, and wherein the load current $I_L$ is plotted as the abscissa. From a consideration of FIGURE 10 it can be appreciated that a larger load current $I_L$ will require less gate current $I_G$ for turn-off, and that hence for increasing values of the load current $I_L$, it is possible that conditions will reach a point where the circuit will turn itself off. For decreasing load current, a large negative polarity gate current $I_G$ is required for turn-off, the largest current for a given value of bias resistance $R_B$, being in the neighborhood of a load current of two milliamperes. For example, for a value of bias resistance $R_B$=180 k. a gating current $I_G$ of −96 microamps is required to turn off a load current of approximately 3 milliamps. If the load current $I_L$ is reduced below this value, the negative turn-off gate current $I_G$ will decline in value. As a consequence of the above considerations, it can be appreciated that the smaller the load current variations, the smaller the needed negative turn-off gate current $I_G$, and hence the higher turn-off current gains $K_I$ can be obtained. Such a charactertistic is clearly demonstrated in FIGURE 11 of the drawings.

When being operated in the latch-in relay switching mode, upon the semiconductor device 11 of the circuit of FIGURE 1 being turned-on, and the turn-on gate signal removed, a self-generated negative gate current designated $-I_G'$ will flow out of the high gain gating $p_2$ layer. The magnitude of this self-generated negative gate current $-I_G'$, is primarily a function of the value of the resistor $R_k$ whose value in turn is normally dictated by the need to eliminate spurious triggering of the semiconductor device due to pickup. The effect of this self-generated gate current $-I_G'$ is to produce the above mentioned self-turnoff characteristic. For example, assume a value of resistance for the resistor $R_k$ of 20 kilo-ohms, and that the semiconductor device is initially turned on by the application of a positive gating signal to the high gain gating $p_2$ layer and the gating on signal is then removed. As a consequence of the conduction in the semiconductive device, a self-generated, negative gate current $-I_G'$ of approximately 22.5 microamperes will flow out of the high gain gating $p_2$ layer, and through the resistor $R_k$. If the self-generated negative gate current $-I_G'$ produced in this fashion is greater than the normal negative polarity gating current $-I_G$ necessary for the turn-off, then the self-generated negative gating current $-I_G'$ will turn off the semiconductor device in the above mentioned self-turn-off fashion. For example, if the value of $R_B$ is equal to 180 kilo-ohms, self-turn-off will occur if the load current $I_L$ exceeds 17 milliamps. If the value of the bias resistance $R_B$ is changed to a value of 240 kilo-ohms, and the value of $R_k$ maintained at 20 kilo-ohms, a load current $I_L$ exceeding the value of 11.4 milliamps would produce self-turn-off. Also, from an examination of FIGURE 9, it can be determined that self-turn-off will occur for load currents $I_L$ of less than 3/10 milliamp.

The smallest load current which can flow without causing self-turn-off is termed the holding current. In the above case where the value of the bias resistance $R_B$ was equal to 240 kilo-ohms, the holding current was equal to 3/10 of a milliamp. In the earlier case of the bias resistance $R_B$ equal to 180 kilo-ohms, the holding current was equal to zero where the value of $R_k$ was kept at 20 kilo-ohms. Accordingly, it can be appreciated that the holding current of the circuit of FIGURE 1 can be adjusted in a manner so that its value can be reduced to zero. As stated earlier, the ability to reduce the holding current of the switching circuit to zero value is extremely valuable for the reasons already enumerated above, namely the elimination of a continuous gate signal together with its attendant losses during the on periods of the semiconductor device.

Because of the above enumerated characteristic it can be appreciated that the new and improved amplifier circuit shown in FIGURE 1 may be used as an extremely high sensitivity sensor and power amplifier for high impedance measuring circuits such as a thermistor temperature control. Further, again because of the high turn-on sensitivity, the device may be used as a power amplifier where delicate mechanical contacts provide the initial switching action. Where the original signal to be sensed has a duration of only microseconds, the new and improved circuit in FIGURE 1 will be extremely valuable as a latch-in relay for closing and maintaining a circuit in response to the originally sensed signal. Additionally, because of the high sensitivity and fast turn-on speed, the circuit can be used as a readout amplifier for core memories, and not only perform logic, but also function as a power amplifier for such devices as print hammers, magnetic clutches, brakes, and the like.

FIGURE 2 of the drawings is the equivalent circuit of the new and improved amplifier shown in FIGURE 1 of the drawings with the exception that a different symbol is used to depict the semiconductor device 11. In FIGURE 1 of the drawings, a four-layer three-junction p-n-p-n semiconductor device 11 is illustrated whereas the symbol 11 used in FIGURE 2 is that adopted by circuit engineers of the Semiconductor Products Department of the General Electric Company to depict a similar four-layer three-junction p-n-p-n semiconductor device having two accessible gates. Symbol 11 used in the FIGURE 2 circuit is illustrated as having a terminal called C (cathode) connected to the outer n-layer of the device, and a terminal called A (anode) connected to the outer p-layer of the device, a terminal marked ($G_C$) connected to the inner high-gain gate *p* of the device, and another terminal marked ($G_A$) connected to the inner low-gain gate *n* of the device. With the exception of the different symbol 11 used to depict the four-layer p-n-p-n semiconductor device, the circuit of FIGURE 2 is identical in construction and operation to the circuit of FIGURE 1 with the exception of the inclusion of a capacitor 19 connected between the high gain gate $p_2$ and the negative terminal of the power supply. As such a capacitor 19 is included in the cathode-gate circuit only for the purpose of preventing spurious gating-on of the semiconductor device where high noise background signal sources might be coupled to the device, it is entirely possible that such a capacitor would not be required with less noisy environment, and hence is not illustrated in the circuit of FIGURE 2. In all other respects, the circuit of FIGURE 2 functions in the same manner as the circuit of FIGURE 1, and further incorporates all of the operating characteristics of the circuit of FIGURE 1 described above, and hence will not be described in further detail.

FIGURE 2*a* of the drawings illustrates still a third symbol that is often used to depict a four layer, three junction p-n-p-n semiconductor device having two accessible gates. The symbol 11 shown in FIGURE 2*a* depicts such a device which includes a cathode in effect (C) connected to the outer n-layer, an anode in effect (A) connected to the outer p-layer, an anode gate in effect ($G_A$) connected to the inner low gain gate *n*, and a cathode gate in effect ($G_C$) connected to the inner high gain gate *p*. Since the substitution of the symbol 11 shown in FIGURE 2*a* in the circuit arrangement of FIGURE 2 would be a straight forward substitution involving connections of the points marked A, C, $G_A$ and $G_C$ to the corresponding points in the circuit of FIGURE 2, it was not believed necessary to show the symbol 11 of FIGURE 2*a* in a complete circuit arrangement. It of course follows that any such circuit arrangement employing the symbol 11 of FIGURE 2*a* would function in precisely the same manner as the circuits of FIGURES 1 and 2, and incorporate the same desirable operating characteristics enumerated in connection with the description of the FIGURE 1 circuit.

In order to appreciate the significance of the circuit arrangement of FIGURE 1, and to fully comprehend its departure from the art, the partial circuits of FIGURES 3*a* through 3*d* have been illustrated. FIGURES 3*a* and 3*b* really constitute the same circuit wherein a different symbol 11' is used to depict a conventional SCR having only one accessible gate. Such devices are usually depicted by the symbols shown at 11' in FIGURES 3*a* and 3*b*, and are usually interconnected in circuit relationship in the manner shown with the load to be supplied connected to what is in effect the anode A of the device. FIGURES 3*c* and 3*d* illustrate four-layer three-junction p-n-p-n devices 11 having two accessible gate electrodes marked as the anode gate $G_A$ and the cathode gate $G_C$. Such devices heretofore in the art have been interconnected with the load to be supplied connected to what is in effect the anode marked A of the device in the manner shown. From a comparison of FIGURES 3*c* and 3*d* to any of FIGURES 1, 2 or 2*a* it can be appreciated that in place of the load to be supplied being connected to what is in effect the anode A of the device, applicant has provided a biasing signal source. The biasing signal source may constitute a variable biasing resistor such as shown at 12, or may constitute a separate biasing signal source interconnected to the p-n-p-n semiconductor device 11 in the manner indicated. Further, in applicant's novel circuit, the load to be supplied is connected to what is considered to be the anode gate $G_A$ of the device in contrast to the prior art arrangements shown in FIGURES 3*c* and 3*d* where the load is interconnected to what is in effect the anode A of the semiconductor device. The desirable differences in operating characteristics obtained by connecting the load in the manner shown in FIGURES 1, 2 and 2*a*, and enumerated in the preceding discussion, can be attributed to this difference in circuit fabrication.

The circuit shown in FIGURE 4 of the drawings is still a different form of new and improved amplifier circuit constructed in accordance with the invention. In the amplifier circuit of FIGURE 4, a four-layer, three-junction p-n-p-n semiconductor device 21 is employed which, in contrast to the p-n-p-n- device 11 of the FIGURE 1 circuit, is comprised by an outer $p_1$ layer, a gate $n_1$, a low gain gate $p_2$, and an outer $n_2$ layer. As can be determined from a comparison of the enumeration of the characteristics of the $p_1$, $n_1$, $p_2$ $n_2$ layers, the characteristics of these layers are exactly the reverse of the characteristics of the equivalent layers in the semiconductor device 11 of the FIGURE 1 circuit arrangement. The p-n-p-n semiconductor device 21 possesses exactly the same characteristics as a current controlling element as the p-n-p-n device 11 when connected in a reciprocal circuit arrangement such as that illustrated in FIGURE 4. To obtain such reciprocal circuit arrangement, the outer $p_1$ layer is connected directly to the positive terminal of the source of electric potential. The high gain gate $n_1$ is connected to a suitable source of gating signals comprised by the variable source of potential 15 through a polarity reversing switch 16, and a variable resistor 17. The variable resistor 18 and capacitor 19 are interconnected between the high gain gate $n_1$ and the positive terminal of the source of electric potential in order to suppress spurious noise pulses that might be applied to the semiconductor device 21 to inadvertently turn the device on. The circuit is completed by a load circuit comprised by a variable resistor 13 connected to the low gain gate $p_2$, and to the negative terminal of the source of electric potential, and a biasing resistor 12 is connected between the outer $n_2$ layer and the negative terminal of the source of electric potential. As stated previously, the circuit arrangement in FIGURE 4 when thus fabricated will operate in a manner similar to the circuit of FIGURE 1. Because the operation is so similar to the operation of circuit shown in FIGURE 1, it is believed unnecessary to again describe these operating characteristics with respect to the circuit arrangement of FIGURE 4. With regard to the availability of the p-n-p-n semiconductor device 21, such a device has been described in the literature in an article entitled, "Dynatron-Like Transistor and Its Application," by Akihiko Sato, Akio Fujie and Keiichiro Kagiyamo appearing in the NEC Research and Development publication, September 1961, on pages 6 through 11. Because the fabrication of such a p-n-p-n device has been described in the literature, it is believed unnecessary to further recite the details of the manufacture of this device.

The circuit shown in FIGURE 5 of the drawings is the equivalent of the circuit shown in FIGURE 4, with the exception that a different symbol 21 is employed to depict the p-n-p-n- semiconductor device. The symbol shown at 21 in FIGURE 5 is suggested by the Institute of Radio Engineers to depict a four-layer p-n-p-n semiconductor having two accessible gates comprised by an anode gate $G_A$ and a cathode gate $G_C$. Since the circuit of FIGURE 5 is the equivalent of the FIGURE 4 circuit, it follows that it operates in a similar manner to the circuit arrangement of FIGURE 1 and possesses the same operating characteristics. For this reason it is believed unnecessary to describe further the nature of operation of the FIGURE 5 circuit arrangement. The circuit branch shown in FIGURE 5*a* of the drawing is intended for substitution in the circuit arrangements shown in FIGURE 5. The circuit branch of FIGURE 5*a* employs a different symbol 21 to depict the four layer p-n-p-n semiconductor device, which symbol is often used by electrical engineers in the fabrication of circuits employing such devices. The circuit branch shown in FIGURE 5*a* is intended for substitution in the circuit of FIGURE 5 where the proper connection of the various circuit elements to the so-called anode A of the four layer p-n-p-n semiconductor device, the anode gate $G_A$, the cathode gate $G_C$, and the so-called cathode C of the device are believed to be readily apparent by connection to the similarly marked points in the FIGURE 5 circuit. Since the circuit element shown as 21 in FIGURE 5*a* is the full electrical equivalent of the circuit element marked 21 in FIGURE 5, it is believed obvious that circuits employing either symbol would be identical in construction and operation.

A new and improved inverter circuit constructed in accordance with the principles of the present invention is illustrated in FIGURE 6 of the drawings. The inverter circuit shown in FIGURE 6 is comprised by a pair of turn-off SCR's 22 and 23, each formed by a four-layer, three-junction p-n-p-n semiconductor device having two accessible gates. Each of the p-n-p-n semiconductor devices 22 and 23 is comprised by an outer $n_2$ layer, a high gain gate $p_2$ contiguous to the outer $n_2$ layer, a low gain gate $n_1$ contiguous to the $p_2$ layer and an outer $p_1$ layer contiguous to the low gain gate $n_1$. Each of the p-n-p-n semiconductor devices 22 and 23 is connected across a source of electrical potential comprised by a battery 24 through biasing resistors 25, 26, respectively. The high gain gate $p_2$ of each device is connected through a respective R-C coupling circuit comprised by a resistor 27 and coupling capacitor 28 to the respective ends of a center tapped secondary winding 29 of a signal input transformer. The signal input transformer has it primary winding 31 connected across a suitable source of square wave gating signals, and the center tap point of winding 29 is connected to the negative terminal of battery in common with the high efficiency emitting $n_2$ layers of each of the semiconductor devices 22 and 23. The low gain gate $n_1$ of the p-n-p-n semiconductor devices 22 and 23 are connected through respective winding halves 32 and 33 of a center tapped output winding back to the positive terminal of battery 24 in common with the biasing resistors 25 and 26. The winding halves 32 and 33 are inductively coupled to secondary windings 34 and 35 respectively which are connected in series circuit relationship across a load 36 to be supplied. For purposes of illustration only, the circuit values for certain of the parameters of the circuit have been indicated. These values should be considered as illustrative only of one particular embodiment of an inverter circuit constructed in accordance with the invention, and should not be considered as limiting.

In operation, an essentially square wave gating signal is supplied from the input transformer winding 29 to the respective high gain gates $p_2$ of each of the semiconductor devices 22, 23. Application of a positive polarity potential to the high gain gates $p_2$ of the device 22, for example, causes this device to be rendered conductive, and to supply load current through winding half 32 to load 36. Concurrently, a negative polarity potential will be applied to the high gain gate $p_2$ of the semiconductor device 23 which will keep this device in its high impedance or blocking state. On the succeeding half-cycle of the applied input squarewave gate signal, the reverse situation will occur wherein a positive going potential will be applied to the high gain gate $p_2$ of the semiconductor device 23, and a negative going gate potential will be applied to the high gain gate $p_2$ of the semiconductor device 22. As a consequence during this half-cycle, the semiconductor device 23 will be rendered conductive, and supply load current through the winding half 33 to load 36. Accordingly, during alternate half-cycles, an essentially square wave output signal will be developed across the load 36 as a result of alternate conducting periods of the semiconductor devices 22 and 23. It should be noted, that because of the use of the turn-off SCR devices 22 and 23, and by proper adjustment of the biasing resistors 25 and 26, the semiconductor devices 22 and 23 can be operated in their latch-in mode or their nonlatch-in mode, dependent upon the nature of the signal input, so that they can be readily turned off either by the application of a negative polarity gating signal to the high gain gates $p_2$ thereof, or by the absence of a gating signal. Because of this characteristic of operation, no commutating circuitry is required in order to turn-off the semiconductor devices once they have been rendered conductive. As a consequence, this circuit is much cheaper and simpler to manufacture, has fewer losses, and can operate at much higher frequencies than previous inverter circuits employing SCR's having only a single gate.

From the foregoing description, it can be appreciated that the present invention provides a new and improved turn-off SCR amplifier circuit having a variable A.-C. gain. Further, the new and improved amplifier is capable of dual threshold or tri-stable operation. It may be readily modified to provide turn-on, turn-off operation of either the latch-in mode or the nonlatch-in mode, and when so operated, it can be so adjusted as to attain effective gains which are approximately twenty times better than the original gain of the device when operated in a normal SCR manner. The device can be adjusted to operate to provide inherent over-current cut-off, as well as to require zero holding current. Because of these many new and unusual characteristics possessed by a single circuit configuration, the invention makes available a new circuit tool for use by control and information engineers in the fabrication of control and information circuits.

Having described several embodiments of a new and improved amplifier circuit, constructed in accordance with the invention, it is believed obvious that other modifications and variations of the invention are possible in the light of the above teachings. It is, therefore, to be understood that changes may be made in the particular embodiments of the invention described which are within the full intended scope of the invention as defined by the appended claims.

What I claim as new and desire to secure by Letters Patent of the United States is:

1. A new and improved amplifier circuit including in combination a turn-off silicon controlled rectifier comprised by a four-layer p-n-p-n semiconductor device having an outer n layer, an outer p layer, a high gain gate *p* contiguous to said outer n layer, and a low gain gate *n* contiguous to the outer p layer, means for connecting a source of electric potential across said device, biasing means adapted to be connected in circuit relationship with both said outer layers through the source of electric potential, load means operatively connected through the low gain gate *n* to the source of electric potential, said load means and said biasing means being connected in parallel circuit relationship to said source of electric potential, and a gate signal source operatively connected to the high gain gate *p*.

2. A new and improved amplifier circuit including in combination a turn-off silicon controlled rectifier comprised by a four-layer p-n-p-n semiconductor device having an outer p layer, an outer n layer, a high gain gate *n* contiguous to said outer p layer, and a low gain gate *p* contiguous to the outer n layer, means for connecting a source of electric potential across said device, biasing means adapted to be connected in circuit relationship with both said outer layers through the source of electric potential, load means operatively connected through the low gain gate *p* to the source of electrical potential, said load means and said biasing means being connected in parallel circuit relationship to said source of electric potential, and a gate signal source operatively connected to the high gain gate *n*.

3. A new and improved amplifier circuit including in combination a turn-off silicon controlled rectifier comprised by a four-layer p-n-p-n semiconductor device having two outer layers, a high gain gate contiguous to one of said outer layers, and a low gain gate contiguous to the remaining outer layer, means for connecting a source of electric potential across said device, biasing means adapted to be connected in circuit relationship with both said outer layers through the source of electric potential, load means operatively connected through the low gain gate to the source of electrical potential, said load means and said biasing means being connected in parallel circuit relationship to said source of electric potential, and a gating signal source operatively connected to the high gain gate.

4. A new and improved amplifier circuit including in combination a turn-off silicon controlled rectifier comprised by a four-layer, p-n-p-n semiconductor device having at least a cathode electrode in effect connected to an outer n layer, an anode electrode in effect connected to an outer p layer, and first and second gate terminals connected to respective ones of the inner *p* and *n* gates of the device, biasing means operatively connected in the anode-cathode circuit of the device through a source of electric potential, load means operatively coupled through one of said gates to said source of electric potential, said load means and said biasing means being connected in parallel circuit relationship to said source of electric potential, and a gate signal source operatively coupled to the remaining gate.

5. A new and improved inverter circuit including in combination a pair of turn-off silicon controlled rectifiers each comprising four layer p-n-p-n semiconductor devices having two outer layers, a first gate contiguous to one of the outer layers, and a second gate contiguous to the remaining outer layer, means for connecting a source of electric potential across each of said devices, respective biasing means connected in circuit relationship with both the outer layers of the respective semiconductor devices through the source of electric potential, load means interconnected between the first gates of each of the semiconductor devices, said load means and said biasing means being connected in parallel circuit relationship to said source of electric potential, and a gate signal source operatively coupled to the second gates of each of the semiconductor devices.

6. A new and improved inverter circuit including in combination a pair of turn-off silicon controlled rectifiers each comprising four layer p-n-p-n semiconductor devices having an outer n layer, an outer p layer, a high gain gate *p* contiguous to the outer n layer, and a low gain gate *n* contiguous to the outer p layer, means for connecting a source of electrical potential across the outer layers of each of said devices, a biasing resistor connected between the outer p layer of each respective semiconductor device and the positive terminal of the source of electric potential, a center tapped output winding connected between the low gain gates of each of the semiconductor devices with the center tap of the winding being connected to the positive terminal of the source of electric potential, said center tapped winding halves and said biasing resistors being connected in parallel circuit relationship to said source of electric potential, load means inductively coupled to said center tapped output winding, and a gate signal source operatively coupled to the high gain gate of each of the semi-conductor devices.

References Cited by the Examiner

UNITED STATES PATENTS

| | | | |
|---|---|---|---|
| 2,655,610 | 10/1953 | Ebers | 307—88.5 |
| 2,722,649 | 11/1955 | Immel et al. | 307—88.5 |
| 2,993,154 | 7/1961 | Goldey et al. | 317—234 |
| 3,065,360 | 11/1962 | Vallese | 307—88.5 |
| 3,097,335 | 7/1963 | Schmidt | 307—88.5 |

ARTHUR GAUSS, *Primary Examiner.*

B. P. DAVIS, *Assistant Examiner.*